United States Patent
Hsieh et al.

(10) Patent No.: US 8,683,392 B2
(45) Date of Patent: Mar. 25, 2014

(54) DOUBLE PATTERNING METHODOLOGY

(75) Inventors: Ken-Hsien Hsieh, Taipei (TW);
Huang-Yu Chen, Zhudong Township, Hsinchu County (TW); Jhih-Jian Wang, Taiping (TW); Cheng Kun Tsai, Hsinchu (TW); Tsong-Hua Ou, Taipei (TW); Wen-Chun Huang, Tainan (TW); Ru-Gun Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 144 days.

(21) Appl. No.: 13/188,071

(22) Filed: Jul. 21, 2011

(65) Prior Publication Data

US 2013/0024822 A1    Jan. 24, 2013

(51) Int. Cl.
*G06F 17/50* (2006.01)

(52) U.S. Cl.
USPC .......... 716/52; 716/51; 716/53; 716/54; 716/55

(58) Field of Classification Search
USPC ............... 716/50, 51, 52, 53, 54, 55
See application file for complete search history.

(56) References Cited

U.S. PATENT DOCUMENTS

| | | | |
|---|---|---|---|
| 8,473,873 B2 * | 6/2013 | Hsu et al. | 716/51 |
| 2004/0015808 A1 * | 1/2004 | Pang et al. | 716/19 |
| 2006/0242619 A1 * | 10/2006 | Pang et al. | 716/19 |
| 2011/0004858 A1 * | 1/2011 | Chang et al. | 716/122 |

* cited by examiner

*Primary Examiner* — Thuan Do
*Assistant Examiner* — Brian Ngo
(74) *Attorney, Agent, or Firm* — Haynes and Boone, LLP (57) ABSTRACT

Provided is a method of fabricating a semiconductor device. The method includes providing an integrated circuit layout plan, the integrated circuit layout plan containing a plurality of semiconductor features. The method includes selecting a subset of the features for decomposition as part of a double patterning process. The method includes designating a relationship between at least a first feature and a second feature of the subset of the features. The relationship dictates whether the first and second features are assigned to a same photomask or separate photomasks. The designating is carried out using a pseudo feature that is part of the layout plan but does not appear on a photomask. The method may further include a double patterning conflict check process, which may include an odd-loop check process.

17 Claims, 10 Drawing Sheets

Fig. 10

DOUBLE PATTERNING METHODOLOGY

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As the geometry sizes shrink, it may be difficult for conventional photolithography processes to form semiconductor features having these small geometry sizes. A double patterning technology method may be used to form the semiconductor features having small geometry sizes. Double patterning methods usually involve a pattern decomposition process, which can be performed at a design stage or at a fabrication stage. However, if the decomposition process is performed at the design stage, the decomposition process may ignore fabrication issues such as load balancing, and thus lead to suboptimal fabrication results. On the other hand, if the decomposition is performed at the fabrication stage, the decomposition process may not be able to fully address design concerns such as critical path mismatches due to double patterning.

Therefore, while existing double patterning methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Semiconductor device sizes continue to shrink during the course of semiconductor fabrication evolution. Consequently, various resolution enhancement techniques (RETs) have been proposed and implemented to accommodate these device size reductions. Double patterning is one of the RETs. In more detail, double patterning extends the capability of lithography tools by decomposing target patterns into double sets and then using different photomasks to generate them on a wafer. The decomposition process is also referred to as a coloring process, since the patterns are assigned different colors in the circuit layout to indicate the corresponding mask. The decomposition process may be performed at a design stage by design and/or layout engineers, which is referred to as a full-colored design. The decomposition process may also be performed at later stages after the design stage, for example by a foundry in a fabrication stage, which is referred to as an uncolored design.

It is also understood that the decomposition criteria is not always driven by spacing concerns. In certain situations, two polygons (or other semiconductor features) need to be decomposed due to considerations other than tight spacing. The considerations may indicate that a single patterning process may not be able to properly form the two polygons. For example, these considerations may involve pitch sizes or unfavorable layout styles, etc.

The full-colored design and the uncolored design each have shortcomings. For example, a full-colored design may not adequately address processing-related concerns such as load balancing. As another example, an uncolored design may not adequately address design concerns such as mismatches caused by overlay and process variations that occur during actual fabrication. These shortcomings are discussed below in more detail with reference to FIGS. 1-3.

Figure 1A:
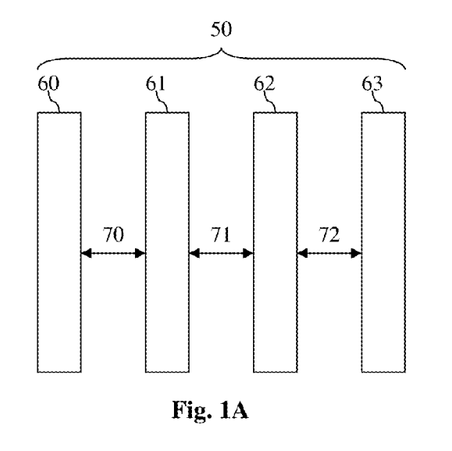
FIGS. 1A-1B illustrate fragmentary top views of an example circuit being decomposed in a double patterning process.

Referring to FIG. 1A, a fragmentary top view of an example layout 50 is illustrated. The layout 50 contains semiconductor features 60-63 (also referred to as semiconductor device patterns). In an embodiment, each of the features 60-63 is a polygon. The semiconductor features 60-63 are spaced apart by distances 70-72. In an embodiment, the distances 70-72 may be smaller than a predetermined distance X. X represents the finest or smallest resolution (smallest spacing) that can be achieved by a photolithography process in a given semiconductor fabrication technology generation. In other words, X is the smallest distance between adjacent semiconductor features that can be formed by the photolithography process without shorting these adjacent semiconductor features together. X varies depending on a variety of factors, these factors include:

A critical dimension (CD) of a semiconductor fabrication process. The critical dimension CD is the smallest feature size that can be formed by the photolithography process.

A wavelength (λ) of a radiation wave (light) used in the photolithography process.

A numerical aperture (NA) of a lens used in the photolithography process.

A process compensation factor (K). The process compensation factor K has a numerical value and is a function of fabrication process parameters such as fabrication cost, acceptable deviation, semiconductor fabrication tool limitations, etc. The process compensation factor K can be tuned or changed. For example, K can be reset if a new photolithography tool such as a scanner is used, or if a new type of photoresist is applied, or that a new etching technology is employed. As an example, K may be in a range that varies from approximately 0.2 to approximately 0.5.

Once the values of λ, K, NA, and CD are determined, the following equation may be used to calculate X:

$$X=(2*\lambda*K/NA)-CD$$

As an example, the value of X in a 22-nanometer (nm) fabrication technology generation may be in a range that varies from about 50 nm to about 80 nm.

Figure 1B:
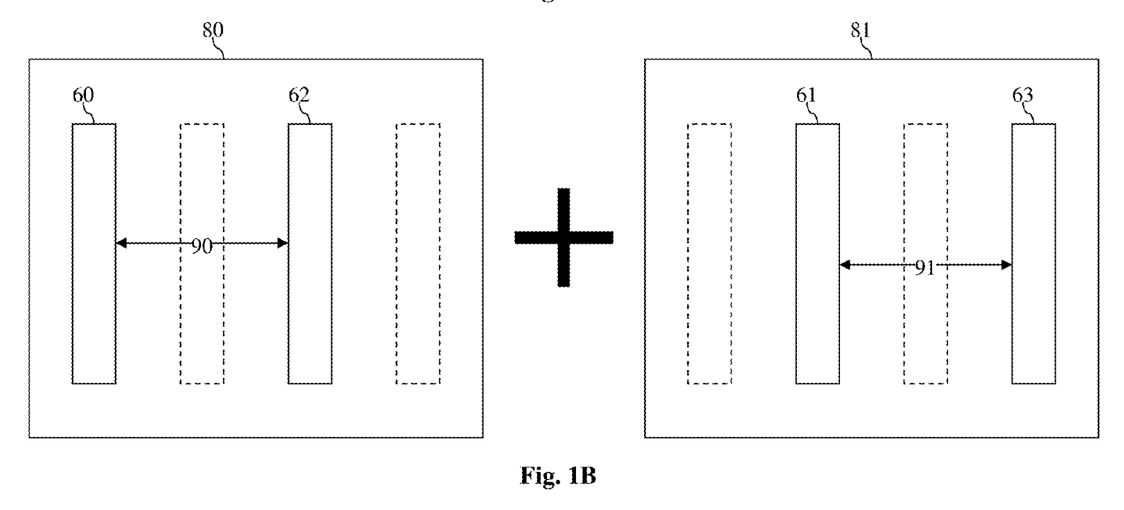

If the spacing distances 70-72 among the features 60-63 are less than X, then existing photolithography equipment alone cannot achieve such small resolution. Therefore, the features 60-63 need to be decomposed into two sets, for example in a configuration shown in FIG. 1B. As illustrated in FIG. 1B, features 60 and 62 are assigned to a photomask 80, and features 61 and 63 are assigned to a different photomask 81. The features 60 and 62 are now separated by a distance 90, and the features 61 and 63 are now separated by a distance 91. The distances 90-91 are greater than X, which means the features 60 and 62 on mask 80 as well as the feature 61 and 63 on mask 81 can now be adequately resolved.

Figure 2A:
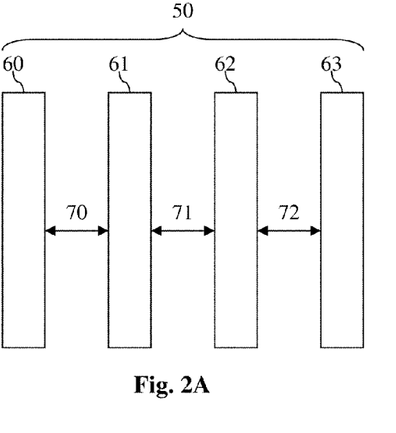
FIGS. 2A-2B illustrate fragmentary top views of an example circuit being assigned to different photomasks which are load imbalanced.
Figure 2B:
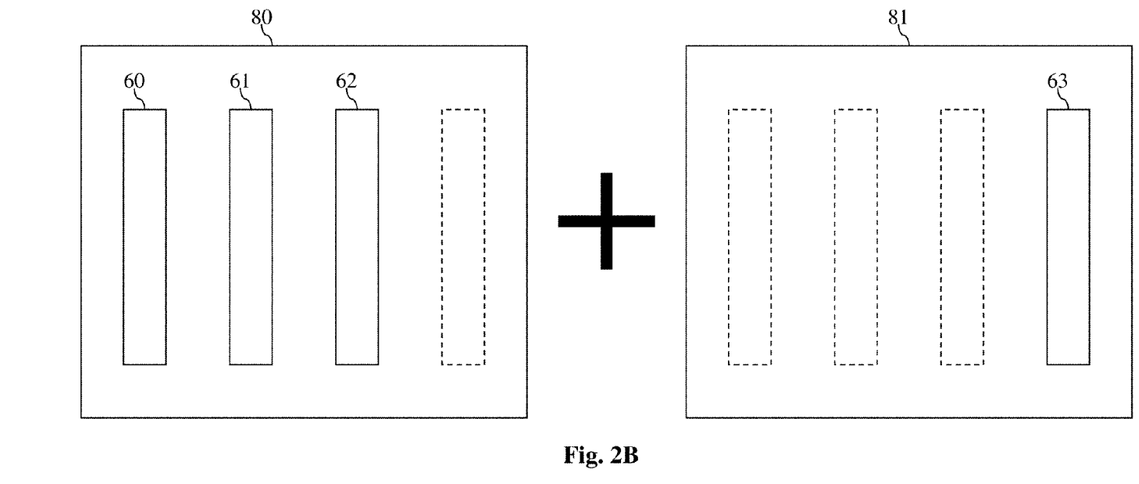

In a full-colored design, the designer or layout engineers typically perform the coloring process (decomposition). However, they may not decompose the features in a manner that takes into account of fabrication concerns such as load balancing. This is illustrated in FIGS. 2A-2B, where features 60-62 are assigned to be on the photomask 80, and the feature 63 is assigned to be on the photomask 81. As such, the pattern density—the total area of the features on a photomask divided by the total area of the photomask—of the photomask 80 is greater than the pattern density on the photomask 81. In other words, the photomasks 80-81 are not properly load balanced. As a result, the semiconductor components formed on the wafer may have uneven sizes and/or depths, which may adversely affect later etching and polishing processes and is therefore undesirable. To solve this load balancing problem, the features need to be carefully assigned in a manner such that pattern densities—including both local area pattern densities and global area pattern densities—are balanced on both photomasks. This would have imposed a great burden for the design and layout engineers in the full-colored design.

Figure 3A:
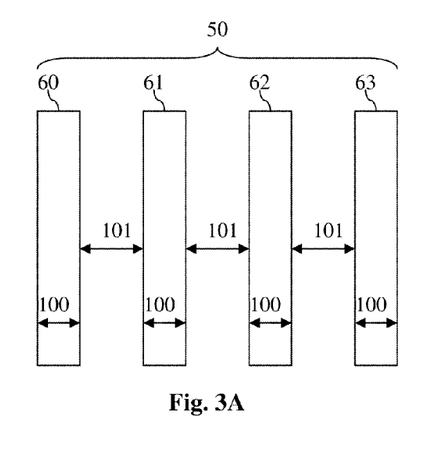
FIGS. 3A-3C illustrate fragmentary top views of an example circuit having mismatches due to double patterning.
Figure 3B:
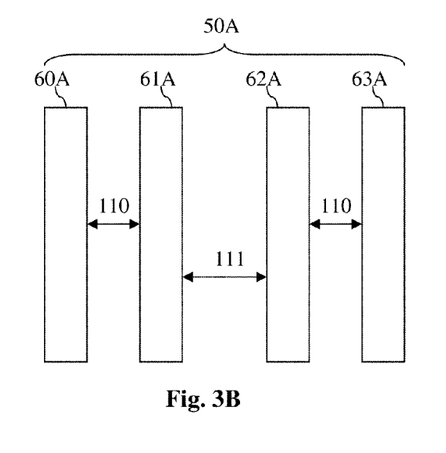
Figure 3C:
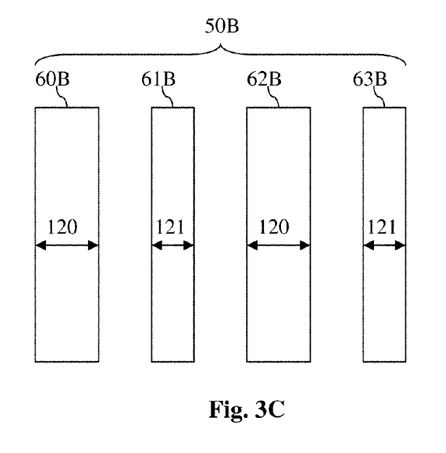

The uncolored design—done at the fabrication stage rather than the design stage—also has its own shortcomings. Referring to FIGS. 3A-3C, FIGS. 3B-3C each represent an actual manufacture layout corresponding to the original layout 50 in FIG. 3A. Due to overlay errors and/or process variations that occur during semiconductor fabrication, the actual manufacture layout 50A suffers from spacing variation problems, and the actual manufacture layout 50B suffers from device dimension variation problems. In more detail, the features 60-63 may all have the same width 100 (lateral dimension as illustrated) and spacing distance 101 in the original design layout 50. But in the actual manufacture layout 50A, the features 60A-61A and 62A-62A may be spaced apart by a distance 110 that is smaller than the distance 101, and the features 61A-62A may be spaced apart by a distance 111 that is greater than the distance 101. Also, in the actual manufacture layout 50B, the features 60B and 62B may have a width (lateral dimension) 120 that is greater than the width 100, and the features 61B and 63B may have a width 121 that is smaller than the width 100.

The spacing variations illustrated in FIG. 3B and the dimension variations illustrated in FIG. 3C are also referred to as mismatches (due to double patterning). These mismatches adversely impact semiconductor device performance, especially for portions of a semiconductor integrated circuit (IC) that are more important to the overall operation of the circuit and/or portions that are more sensitive to mismatches. These portions of a semiconductor IC may be referred to as critical paths (or critical path circuits). In an embodiment, critical path may refer to the slowest electrical path of a circuit. If an uncolored design is used, the double patterning mismatches discussed above could potentially cause unacceptable electrical performance for the critical path circuits and therefore render the entire IC chip defective.

Figure 4A:
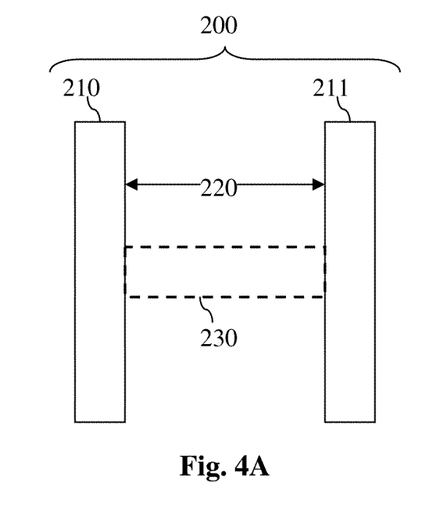
FIGS. 4A-4B illustrate fragmentary top views of an example circuit containing a virtual assistant feature.

According to various aspects of the present disclosure, a partial-colored design is implemented to overcome the shortcomings of the full-colored design and the uncolored design. The partial-colored design according to the present disclosure utilizes various devices to impute a relationship between a subset of features of an IC, so that their decomposition and assignment to photomasks can be determined in a desired manner at the design stage (or layout stage). To illustrate this in more detail, refer to FIGS. 4A and 4B, where fragmentary top views of example circuit layouts are illustrated. In FIG. 4A, a layout 200 contains semiconductor features 210 and 211. In an embodiment, the features 210-211 are features that belong to a critical path circuit, meaning that it is especially desirable to minimize the mismatches caused by double patterning.

The features 210-211 are spaced apart by a distance 220. In an embodiment, the distance 220 is greater than the distance X. As discussed above, this indicates that the features 210-211 can be adequately resolved by photolithography tools. Therefore, the features 210-211 need not be decomposed and assigned to different photomasks in the double patterning process. In fact, since the features 210-211 are portions of a critical path circuit, it may be desirable to leave them both on the same photomask, so that errors due to mismatches will be substantially reduced. However, if an uncolored approach is used, the foundry that is doing the decomposition may not be aware of this, and may indeed put the features 210-211 on separate photomasks. To address this issue, the present disclosure utilizes a virtual or pseudo indicator to designate a "fixed" relationship between the features 210-211, so that they will both be assigned to the same photomask.

In more detail, in the embodiment shown, the virtual indicator is a pseudo assistant feature 230 that appears in the computerized layout file, but does not actually appear on the photomask itself. The presence of the assistant feature indicates that the features 210-211 need to be assigned to the same photomask. In a sense, the assistant feature "bonds" the features 210-211 together. The assistant feature 230 can be added to the layout 200 by the design engineer or the layout engineer (or another suitable entity) at the design stage and before actual fabrication (before photomasks are made). As shown in the layout 200, the assistant feature 230 is disposed between the features 210-211 and may come into physical contact with (or touch) the features 210-211. In other embodiments, the assistant feature 230 may be spaced slightly apart from the features 210-211 on either side.

During the feature decomposition stage in the double patterning process, a semiconductor fabrication system carrying out the double patterning process will detect the assistant feature 230 and recognize that this means the features 210-211 should be put on the same photomask. An appropriate photomask will be generated accordingly thereafter. Stated differently, by inserting the assistant feature 230 into the layout 200, the features 210-211 are guaranteed to be assigned on the same photomask, so as to minimize errors in the critical path caused by mismatches. It may be said that the features 210-211 are "colored" the same in FIG. 4A.

Figure 4B:
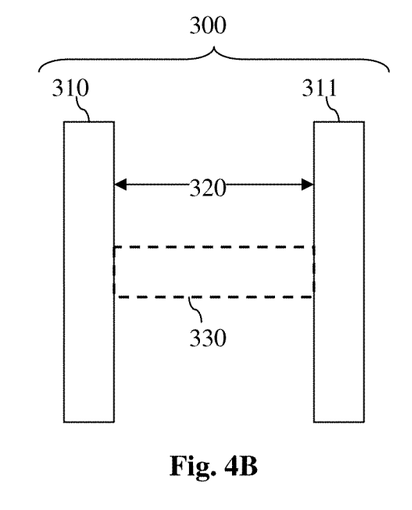

Referring to FIG. 4B, a fragmentary top view of a layout 300 containing semiconductor features 310-311 is illustrated. The semiconductor features 310-311 may also belong to a critical path circuit. The features 310-311 are spaced apart by a distance 330, which may be greater or less than the distance X. Unlike the layout 200 in FIG. 4A, various design and/or fabrication concerns may dictate that the features 310-311 of the layout 300 be assigned to different photomasks. Once again, had an uncolored design been used, the fabrication entity may not be aware of these concerns and may actually assign the features 310-311 to the same photomask.

Here, a design engineer or a layout engineer (or another suitable entity) may insert an assistant feature 330 that imputes a relationship between the features 310-311, such that they will be assigned to separate photomasks. Similar to the assistant feature 230, the assistant feature 330 is a virtual feature or pseudo feature that appears in the computerized layout file but does not appear in the actual photomask. The assistant feature 230 may or may not come into physical contact with the features 310-311.

During the feature decomposition stage in the double patterning process, the system carrying out the double patterning process will detect the assistant feature 330 and recognize that this means the features 310-311 should be put on different photomasks. Appropriate photomasks will be generated accordingly thereafter. Stated differently, by inserting the assistant feature 330 into the layout 300, the features 310-311 are guaranteed to be assigned to different photomasks, so as to address the appropriate concerns of an IC, for example concerns related to a critical path of the IC. It may be said that the features 310-311 are "colored" differently in FIG. 4B.

Other suitable devices may be used as virtual indicators to designate the relationship between semiconductor features on an IC. For example, referring to FIGS. 5A and 5B, coloring markers M1 and M2 (rather than assistant features 230 and 330) may be used to designate the properties of the features 210-211 and 310-311. Features labeled with M1 are colored one way and are guaranteed to be assigned on photomask 1. Features labeled with M2 are colored a different way and are guaranteed to be assigned on photomask 2.

Figure 5A:
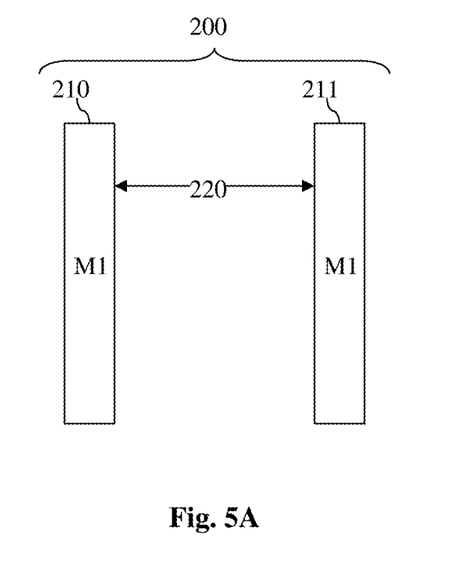
FIGS. 5A-5B illustrate fragmentary top views of an example circuit containing a coloring marker.
Figure 5B:
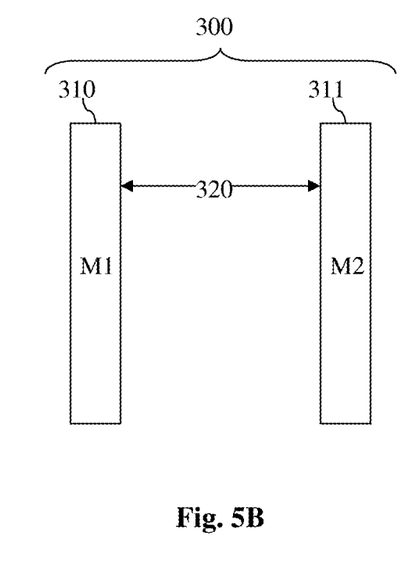

In the embodiment illustrated, the features 210-211 are colored the same way and are guaranteed to be assigned to the same photomask. The features 310-311 are colored differently and are guaranteed to be assigned to different photomasks. It is understood that, similar to the assistant features 230 and 330, these markers M1-M2 may be considered virtual or pseudo indicators and do not have a physical correspondence on the photomasks. During decomposition, the double patterning system will recognize these markers and thus put the features 210-211 on the same photomask and put the features 310-311 on different photomasks accordingly. Also, the markers M1-M2 may or may not necessarily be visible in the circuit layout file. In some embodiments, the coloring markers M1-M2 may be inserted as a part of the feature's property, and as such may be visually hidden, as long as they are still recognizable by the integrated circuit layout tool.

It is understood that relationship-indicators other than the virtual indicators and markets discussed above may be used as coloring assistant features. These other relationship-indicators may employ corresponding text, color marker, and/or tables to indicate appropriate coloring relationships between desired features.

Based on the discussions above, it can be seen that the present disclosure utilizes devices (such as assistant features and markers) to designate "fixed" relationships between features of a subset of an IC, for example a critical path circuit portion. The entity performing the coloring need not color the entire IC. As such, the present disclosure involves a partial coloring process. To ensure that no conflicts are created by the partial coloring process described above, a double patterning conflict check process is also implemented. The double patterning conflict check process is similar to a design rule check (DRC) process, and is also known as a G0-rule check herein. In one embodiment, the double patterning conflict check process identifies "odd loops," which is discussed below in more detail with reference to FIG. 6.

Figure 6:
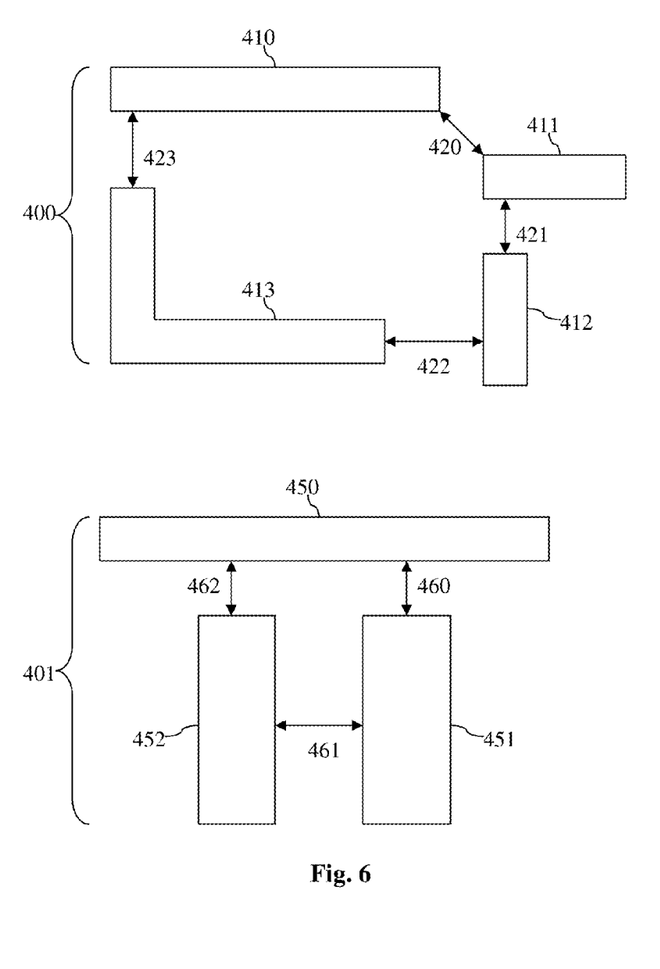
FIG. 6 illustrates fragmentary top views of an even-loop circuit and an odd-loop circuit.

Referring to FIG. 6, fragmentary top views of an example circuit layout 400 and an example circuit layout 401 are illustrated. The circuit layout 400 contains semiconductor features 410, 411, 412, and 413. The features 410 and 411 are spaced apart by a distance 420, the features 411 and 412 are spaced apart by a distance 421, the features 412 and 413 are spaced apart by a distance 422, and the features 413 and 410 are spaced apart by a distance 423. In an embodiment, the distances 420-423 are each smaller than the predetermined distance X.

As is illustrated, the features 410-413 form a loop that has an even number of components, since there are four features in the loop. The even number of loop components means that the features 410-413 can be decomposed and assigned to different photomasks without encountering issues, even if the spacing distances 420-423 are smaller than X. For example, the features 410 and 412 may be assigned to one photomask, while the features 411 and 413 may be assigned to another photo photomask. The features 410 and 412 will be sufficiently spaced apart from one another, and the features 411 and 413 will also be sufficiently spaced apart from one another. Accordingly, the double patterning conflict check process will not find errors in the example circuit layout 401. The double patterning process may continue accordingly.

One the other hand, the circuit layout 401 contains semiconductor features 450, 451, and 452. The features 450 and 451 are spaced apart by a distance 460, the features 451 and 452 are spaced apart by a distance 461, and the features 452 and 450 are spaced apart by a distance 462. In an embodiment, the distances 460-462 are each smaller than the predetermined distance X.

The features 450-452 form a loop that has an odd number of components, since there are three features in the loop. The odd number of loop components means that the features 450-453 cannot be decomposed and assigned to different photomasks without encountering problems if the distances 460-462 are smaller than X. For example, if the features 450 and 451 are assigned on the same photomask while the feature 452 is assigned on another photomask, then the features 450 and 451 will be located too close to each other (since the distance 460 is smaller than X), and they cannot be sufficiently resolved by photolithography equipment. Similarly, if the features 450 and 452 are assigned on the same photomask, they will not be adequately resolved either, since the spacing distance 462 is smaller than X. The same is true if the features 451 and 452 are assigned on the same photomask.

It can thus be seen that a loop having an odd number of components (whose spacings between adjacent features are less than X) will have at least two adjacent features that in effect cannot be "split." As such, they cannot be correctly decomposed, and the double patterning process should not continue. When the double patterning conflict check process identifies such odd-loops, it will generate an error and ask the design or layout engineer to adjust the design or layout so as to eliminate the odd-loop issues.

It is understood that the circuit layouts 400-401 illustrated in FIG. 6 are merely examples, and that the even or odd loop concept may apply to loops having any other number of components. For example, an even loop may have 6, 8, 10, 12, etc, number of components, and an odd loop may have 5, 7, 9, 11, etc, number of components. Also, the shapes or sizes of the polygons of each feature in the loop may vary in other situations. It is also understood that the double patterning conflict check process is not limited to the coloring situations described above. In some embodiments, the double patterning conflict check process applies to methods that directly color all the features to be decomposed.

Figure 7A:
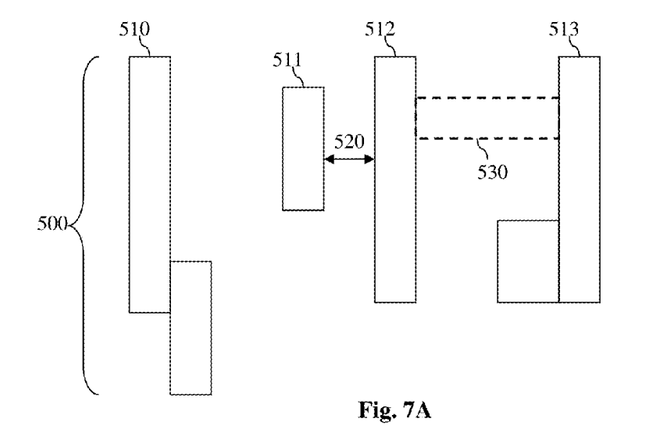
FIGS. 7A-7B illustrate fragmentary top views of an example circuit before and after a coloring process.

FIGS. 7A-7B and 8A-8B further illustrate the coloring process using a virtual indicator and the subsequent double patterning conflict check process. Referring to FIG. 7A, a fragmentary top level view of a simplified example circuit layout 500 is illustrated. The circuit layout 500 belongs to a critical path portion of an IC layout and contains a plurality of features 510-513 that may each be a polygon of various shape and size. The features 511-512 are spaced apart by a distance 520 that is less than X. This means that the features 511-512 need to be assigned to different photomasks because they could not be adequately resolved with a single photomask.

For load balancing purposes, it is desired that the features 510-511 are both assigned to one photomask, while the features 512-513 are both assigned to another photomask. To guarantee this type of assignment, a virtual indicator in the form of a pseudo assistant feature 530 may be inserted between the features 512-513. In the embodiment shown, the assistant feature 530 designates a relationship between the features 512-513 so that they will be assigned to the same photomask. A similar assistant feature may be inserted between the features 510-511 if it is desired that these features be assigned to the same photomask. For the sake of simplicity, this assistant feature is not illustrated herein.

Figure 7B:
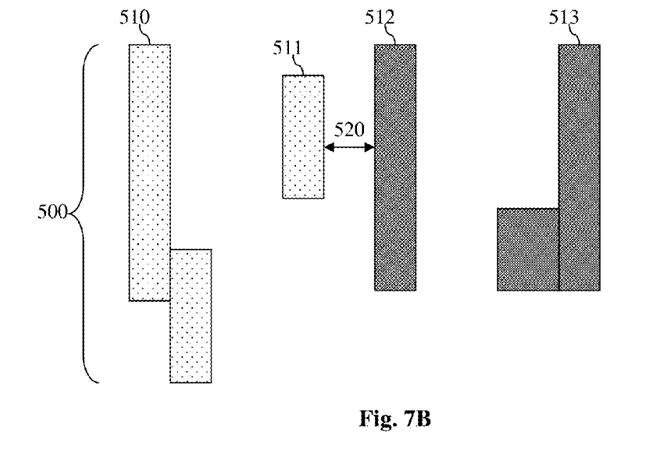

FIG. 7B is a fragmentary top view of the circuit layout 500 after the features 510-513 have been assigned, or "colored." The assignment or coloring of the features may be visually observed in FIG. 7B by the different types of shading of the features 510-513. In more detail, the features 510-511 are colored the same since they are assigned on the same photomask, and the features 512-513 are colored the same since they are assigned on the same photomask. But the features 510-511 are colored differently from the features 512-513. After the coloring process is performed, a double patterning conflict check process is performed to detect potential design/layout violations. In the embodiment illustrated herein, there are no odd-loops, so the double patterning conflict check process will not yield errors, and the double patterning process may proceed accordingly.

Figure 8A:
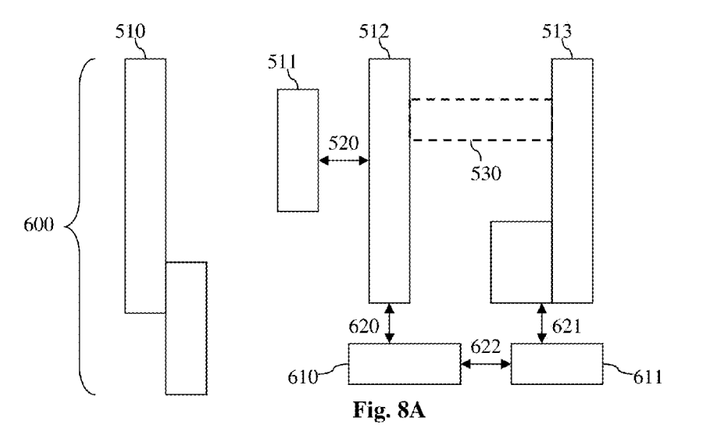
FIGS. 8A-8B illustrate fragmentary top views of another example circuit before and after a coloring process.
Figure 8B:
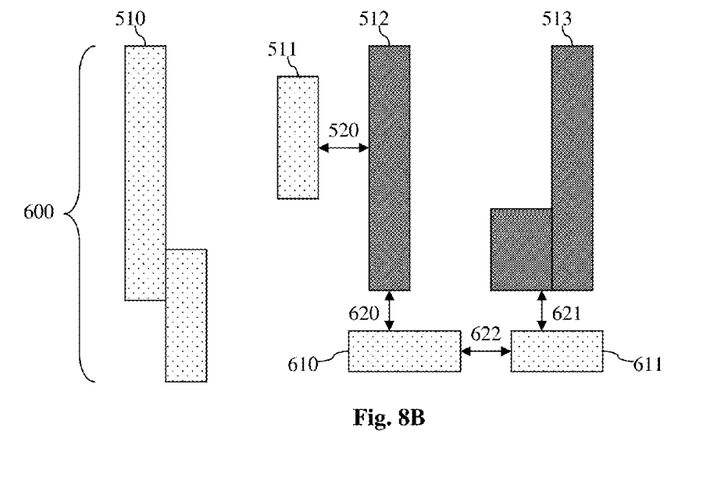

FIGS. 8A and 8B are top views of an example circuit layout 600 before and after a coloring process is performed, respectively. The circuit layout 600 contains a number of components that appear in the circuit layout 500 illustrated in FIGS. 7A and 7B, and these components are labeled the same for the sake of consistency and clarity. The circuit layout 600 also contains features 610 and 611. The feature 610 is spaced apart from the feature 512 by a distance 620, the feature 611 is spaced apart from the feature 513 by a distance 621, and the features 610-611 are spaced apart from each other by a distance 622. The distances 620-622 are each less than the predetermined distance X.

Since the assistant feature 530 assigns the features 512-513 to the same photomask, the features 512-513 are treated as a single feature for purposes of counting the number of components within a loop. Thus, an odd loop containing the features 512-513 (as a single component), the feature 610, and the feature 611 is formed. As discussed above, such odd loop means that the features cannot be properly colored (assigned). For example, as illustrated in FIG. 8B, if the features 610 and 611 are colored the same as the features 510-511, while the features 512-513 are colored the same but differently from the rest of the features, then the features 610-611 will be located too close to each other and therefore cannot be adequately resolved. Similar errors will occur regardless of the coloring configuration, though they are not illustrated herein for the sake of simplicity. Therefore, the double patterning conflict check process will fail, and this error needs to be corrected by the design or layout engineer before the double patterning process can proceed.

The partial coloring scheme of the present disclosure discussed above offers advantages, it being understood that different embodiments may offer different advantages, and that no particular advantage is required for all embodiments. One of the advantages of partial coloring is that the design and/or layout engineers are freed from the burden of having to do full coloring, since only critical path circuit portions need to be colored. At the same time, electrical performance will not be compromised because the critical path portions are colored in a way so as to minimize mismatch problems. Partial coloring also benefits fabrication entities such as foundries, since foundries can now tailor the coloring process to their needs, such as optimizing load balance between photomasks.

Another advantage is that the methods and features discussed herein are easy to implement. Furthermore, the double patterning conflict check process will identify errors of the design/layout, which can be corrected before fabrication process continues.

Another advantage offered by the partial coloring scheme herein is its flexibility. In semiconductor design and layout, a plurality of "cells" may be formed. Each cell may include a circuit or a sub-circuit, which contains a plurality of semiconductor features. Traditionally, a full-colored design requires each feature of the cell to be colored in a certain way. The cell may then be copied/duplicated and placed elsewhere on the IC chip. However, problems may arise as one or more of the colored features of the copied cell may present double patterning issues with other features of the IC chip. Since the coloring was done before the cell is placed on the IC, these problems cannot be foreseen and thus can be difficult to avoid.

In comparison, the partial coloring scheme utilizing the pseudo assistant features resolves this problem because the pseudo assistant features merely dictate that the features need to be colored differently (assigned on different photomasks) or the same (assigned on the same photomask). It does not matter how each feature needs to be colored specifically (which particular photomask a specific feature should be assigned to). Consequently, when the features of the duplicated cells run into potential coloring conflicts with other features of the IC, the coloring polarity may be "flipped" to avoid the conflict. Stated differently, the pseudo assistant features used herein allow features of cells to be easily color-flipped so as to bypass coloring conflicts.

Figure 9:
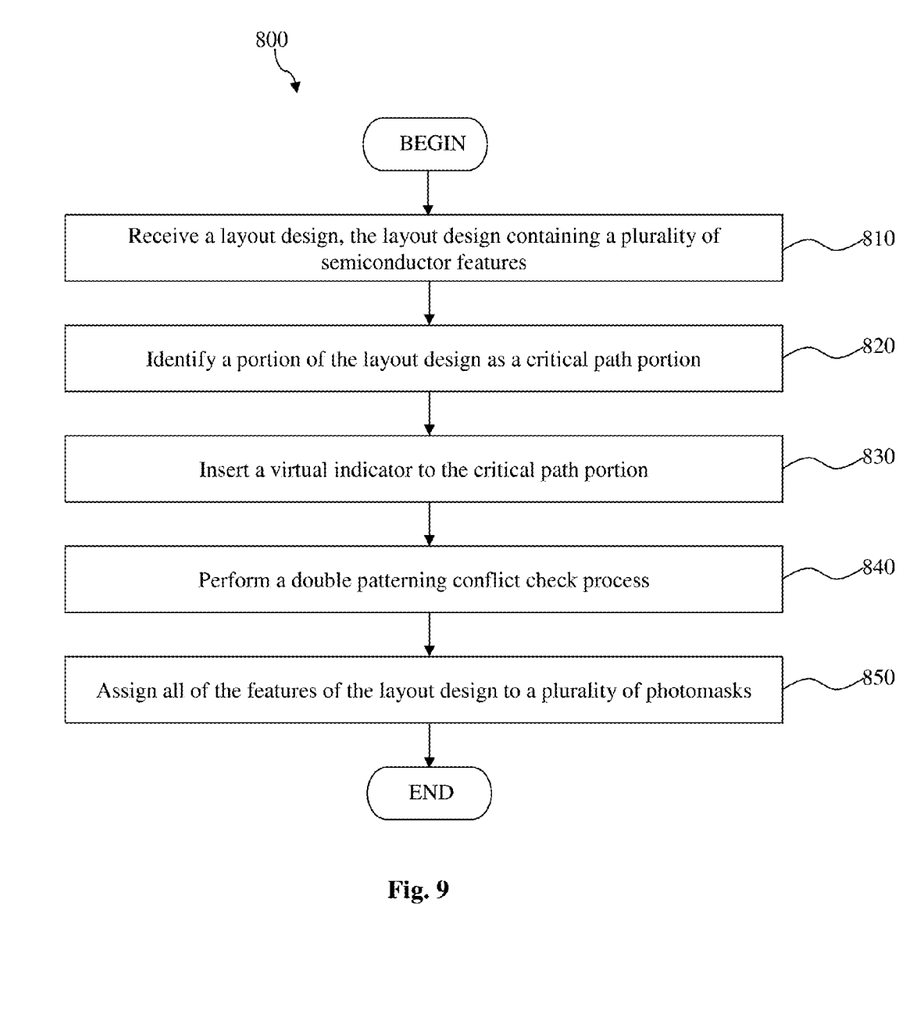
FIG. 9 illustrates a flowchart illustrating a method for patterning a semiconductor device according to various aspects of the present disclosure.

FIG. 9 is a flowchart of a method 800 for carrying out the various aspects of the present disclosure discussed above. The method 800 includes a block 810, in which a layout design for a semiconductor device is received. The layout design contains a plurality of semiconductor features. The method 800 continues with a block 820, in which a portion of the layout design is identified as a critical path portion. It is understood that in some embodiments, the critical path portion of a circuit layout design may include slow electrical paths of a circuit. In other embodiments, the critical path portion of a circuit layout design may also include circuit portions where polygons (e.g., circuit components) need to be colored in a certain manner due to concerns such as process related reasons.

The method 800 continues with block 830, in which a virtual indicator is inserted to the critical path portion. The virtual indicator is operable to fix a relationship between at least two features of the critical path portion, wherein the relationship indicates at least one of: the two features are to be assigned on a single photomask, and the two features are to be assigned on different photomasks. The method 800 continues with block 840, in which a double patterning conflict check process is performed. The method 800 continues with block 850, in which all of the features of the layout design are assigned to a plurality of photomasks, wherein the virtual indicator does not appear on the photomasks.

Figure 10:
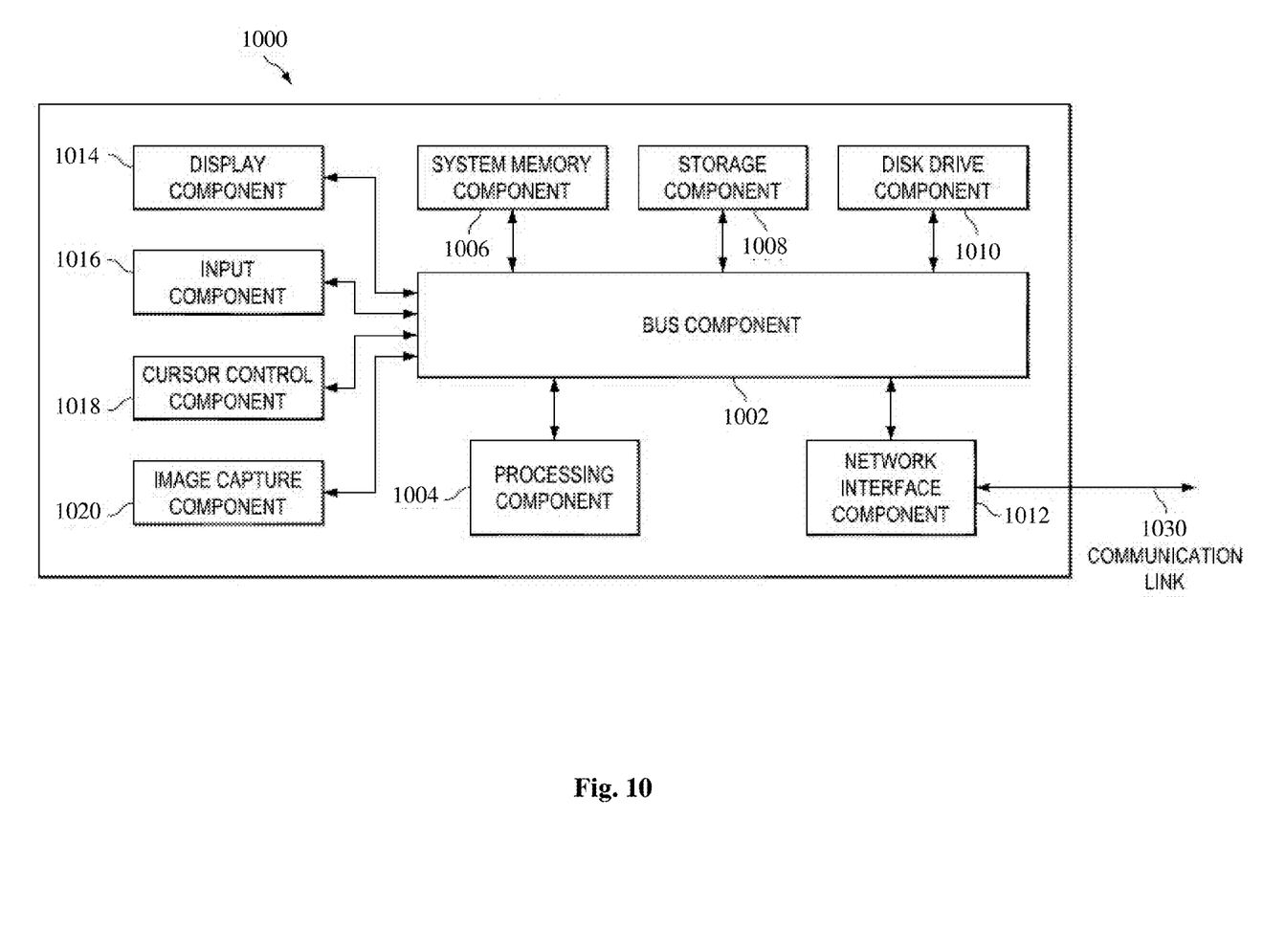
FIG. 10 illustrates a block diagram of a semiconductor fabrication system for carrying out the method of FIG. 9.

FIG. 10 is a block diagram of a computer system 1000 suitable for implementing various methods and devices described herein, for example, the various method blocks of the method 800. In various implementations, the computer system may include a computerized semiconductor fabrication tool, which may include a design tool and a layout tool. The semiconductor fabrication tool may include various types of hardware and software. In one embodiment, the fabrication tool carries out the steps discussed in the method 800 in FIG. 9 in response to engineering input, for example input from design and layout engineers.

In accordance with various embodiments of the present disclosure, the computer system 1000 may include a bus component 1002 or other communication mechanisms for communicating information, which interconnects subsystems and components, such as processing component 1004 (e.g., processor, micro-controller, digital signal processor (DSP), etc.), system memory component 1006 (e.g., RAM), static storage component 1008 (e.g., ROM), disk drive component 1010 (e.g., magnetic or optical), network interface component 1012 (e.g., modem or Ethernet card), display component 1014 (e.g., cathode ray tube (CRT) or liquid crystal display (LCD)), input component 1016 (e.g., keyboard), cursor control component 1018 (e.g., mouse or trackball), and image capture component 1020 (e.g., analog or digital camera). In one implementation, disk drive component 1010 may comprise a database having one or more disk drive components.

In accordance with embodiments of the present disclosure, computer system 1000 performs specific operations by processor 1004 executing one or more sequences of one or more instructions contained in system memory component 1006. Such instructions may be read into system memory component 1006 from another computer readable medium, such as static storage component 1008 or disk drive component 1010. In other embodiments, hard-wired circuitry may be used in place of (or in combination with) software instructions to implement the present disclosure.

Logic may be encoded in a computer readable medium, which may refer to any medium that participates in providing instructions to processor 1004 for execution. Such a medium may take many forms, including but not limited to, non-volatile media and volatile media. In one embodiment, the computer readable medium is non-transitory. In various implementations, non-volatile media includes optical or magnetic disks, such as disk drive component 1010, and volatile media includes dynamic memory, such as system memory component 1006. In one aspect, data and information related to execution instructions may be transmitted to computer system 1000 via a transmission media, such as in the form of acoustic or light waves, including those generated during radio wave and infrared data communications. In various implementations, transmission media may include coaxial cables, copper wire, and fiber optics, including wires that comprise bus 1002.

Some common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read.

In various embodiments of the present disclosure, execution of instruction sequences to practice the present disclosure may be performed by computer system 1000. In various other embodiments of the present disclosure, a plurality of computer systems 1000 coupled by communication link 1030 (e.g., a communications network, such as a LAN, WLAN, PTSN, and/or various other wired or wireless networks, including telecommunications, mobile, and cellular phone networks) may perform instruction sequences to practice the present disclosure in coordination with one another.

Computer system 1000 may transmit and receive messages, data, information and instructions, including one or more programs (i.e., application code) through communication link 1030 and communication interface 1012. Received program code may be executed by processor 1004 as received and/or stored in disk drive component 1010 or some other non-volatile storage component for execution.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as computer program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

One of the broader forms of the present disclosure involves a method of fabricating a semiconductor device. The method includes, providing an integrated circuit layout plan, the integrated circuit layout plan containing a plurality of semiconductor features; selecting a subset of the features for decomposition as part of a double patterning process; and designating a relationship between at least a first feature and a second feature of the subset of the features, the relationship dictating whether the first and second features are assigned to a same photomask or separate photomasks; wherein the designating is carried out using a pseudo feature that is part of the layout plan but does not appear on a photomask.

In an embodiment, the method further includes: after the designating, performing a double patterning conflict check process.

In an embodiment, the double patterning conflict check process includes identifying a loop having an odd number of semiconductor features, wherein respective distances between each feature and its adjacent features are smaller than a predetermined distance.

In an embodiment, the pseudo feature includes a virtual assistant feature that is disposed between the first and second features in the layout plan.

In an embodiment, the pseudo feature includes one or more coloring markers that are assigned to the first and second features.

In an embodiment, the selecting is carried out in a manner such that the subset of the features corresponds to a critical path portion of the circuit layout.

In an embodiment, the selecting and the designating are carried out by a computerized integrated circuit tool.

In an embodiment, the selecting and the designating are carried out by the integrated circuit tool in response to engineering input.

In an embodiment, the method further includes: in response to the designating, assigning all of the features of the layout plan to a plurality of photomasks.

Another one of the broader forms of the present disclosure involves a method of fabricating a semiconductor device. The method includes, receiving a layout design for the semiconductor device, the layout design containing a plurality of semiconductor features; identifying a portion of the layout design as a critical path portion; inserting a virtual indicator to the critical path portion, the virtual indicator being operable to fix a relationship between at least two features of the critical path portion, wherein the relationship indicates at least one of: the two features are to be assigned on a single photomask, and the two features are to be assigned on different photomasks; performing a double patterning conflict check process; and thereafter assigning all of the features of the layout design to a plurality of photomasks, wherein the virtual indicator does not appear on the photomasks.

In an embodiment, the virtual indicator includes at least one of: a pseudo assistant feature and a coloring marker.

In an embodiment, the pseudo assistant feature includes a polygon that is disposed between the two features of the critical path portion.

In an embodiment, the identifying, the inserting, the performing, and the assigning are carried out using a computerized integrated circuit layout tool in response to engineering input.

In an embodiment, the performing the double patterning conflict check process includes identifying one or more loops that are each formed by an odd number of semiconductor features that are spaced apart from adjacent features within said loop by distances less than a predetermined distance, and wherein the predetermined distance corresponds to a minimum resolution of a semiconductor fabrication technology generation.

Yet another one of the broader forms of the present disclosure involves a method of fabricating a semiconductor device. The method includes an apparatus comprising a non-transitory, tangible computer readable storage medium storing a computer program, wherein the computer program has instructions that when executed, perform: providing an integrated circuit layout plan that contains a plurality of semiconductor device patterns; identifying a subset of the semiconductor device patterns as belonging to a critical path portion of the integrated circuit layout plan, the subset containing at least a first semiconductor device pattern and a second semiconductor device pattern; and designating a relationship between the first and second semiconductor device patterns, the relationship indicating whether the first and second semiconductor device patterns are to be assigned to a single photomask or different photomasks, wherein the designating is carried out using a virtual indicator that is part of the layout plan but does not have a physical correspondence on the photomasks.

In an embodiment, the computer program contains additional instructions for performing a double patterning conflict check process after the relationship between the first and second semiconductor device patterns has been designated.

In an embodiment, the instructions for performing the double patterning conflict check process include instructions for identifying a loop formed by an odd number of semiconductor device patterns that are spaced apart from adjacent semiconductor device patterns within the loop by distances less than a predetermined distance.

In an embodiment, the computer program contains additional instructions for providing said virtual indicator, the virtual indicator including at least one of: a pseudo semiconductor device pattern and a coloring marker.

In an embodiment, the pseudo semiconductor device pattern includes a polygon disposed between the first and second semiconductor device patterns In an embodiment, the computer program contains additional instructions for assigning all of the semiconductor device patterns of the layout plan to a plurality of photomasks in response to the designating.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   providing an integrated circuit layout plan, the integrated circuit layout plan containing a plurality of semiconductor features;
   selecting, by using a computer, a subset of the features for decomposition as part of a double patterning process;
   designating a relationship between at least a first feature and a second feature of the subset of the features, the relationship dictating whether the first and second features are assigned to a same photomask or separate photomasks, wherein the designating is carried out using a pseudo feature that is part of the layout plan but does not appear on a photomask, wherein the pseudo feature includes a virtual assistant feature that is disposed between the first and second features in the layout plan; and assigning a color to the first feature and the second feature based on the pseudo feature, wherein the assigned color indicates a photomask to which the first feature and the second feature have been assigned.

2. The method of claim 1, further including: after the designating, performing a double patterning conflict check process.

3. The method of claim 2, wherein the double patterning conflict check process includes identifying a loop having an odd number of semiconductor features, wherein respective distances between each feature and its adjacent features are smaller than a predetermined distance.

4. The method of claim 1, wherein the pseudo feature includes one or more coloring markers that are assigned to the first and second features.

5. The method of claim 1, wherein the selecting is carried out in a manner such that the subset of the features corresponds to a portion of the circuit layout where coloring control is needed.

6. The method of claim 1, wherein the selecting and the designating are carried out by a computerized integrated circuit tool.

7. The method of claim 6, wherein the selecting and the designating are carried out by the integrated circuit tool in response to engineering input.

8. The method of claim 1, further including: in response to the designating, assigning all of the features of the layout plan to a plurality of photomasks.

9. A method of fabricating a semiconductor device, comprising:

receiving a layout design for the semiconductor device, the layout design containing a plurality of semiconductor features;

identifying a portion of the layout design as a selected portion that needs to be colored;

coloring, by using a computer, at least two features of the selected portion by inserting a virtual indicator to the selected portion, the virtual indicator designating at least one of: the at least two features are to be assigned on a single photomask, and the at least two features are to be assigned on different photomasks, wherein the coloring assigns a color to each of the at least two features, the color corresponding to one of a plurality of photomasks, wherein the virtual indicator includes at least one of a pseudo assistant feature and a coloring marker;

after the coloring of each of the at least two features of the selected portion, performing a double patterning conflict check process; and after the performing of the double patterning conflict check process, assigning the plurality of features of the layout design to the plurality of photomasks based on the color assigned to the each of the at least two features, wherein the virtual indicator does not appear on the photomasks.

10. The method of claim 9, wherein the pseudo assistant feature includes a polygon that is disposed between the two features of the selected portion of the layout design.

11. The method of claim 9, wherein the identifying, the coloring, the performing, and the assigning are carried out using a computerized integrated circuit layout tool in response to engineering input.

12. The method of claim 9, wherein the performing the double patterning conflict check process includes identifying one or more loops that are each formed by an odd number of semiconductor features that are spaced apart from adjacent features within said loop by distances less than a predetermined distance, and wherein the predetermined distance corresponds to a minimum resolution of a semiconductor fabrication technology generation.

13. An apparatus comprising a non-transitory, tangible computer readable storage medium storing a computer program, wherein the computer program has instructions that when executed, perform:

providing an integrated circuit layout plan that contains a plurality of semiconductor device patterns;

identifying a subset of the semiconductor device patterns as belonging to a critical path portion of the integrated circuit layout plan, the subset containing at least a first semiconductor device pattern and a second semiconductor device pattern, wherein the computer program contains additional instructions for providing said virtual indicator, the virtual indicator including at least one of: a pseudo semiconductor device pattern and a coloring marker;

designating a relationship between the first and second semiconductor device patterns, the relationship indicating whether the first and second semiconductor device patterns are to be assigned to a single photomask or different photomasks, wherein the designating is carried out using a virtual indicator that is part of the layout plan but does not have a physical correspondence on the photomasks; and assigning a color to the first semiconductor device pattern and the second semiconductor device pattern based on the virtual indicator, wherein the assigned color indicates one of a plurality of photomasks.

14. The apparatus of claim 13, wherein the computer program contains additional instructions for performing a double patterning conflict check process after the relationship between the first and second semiconductor device patterns has been designated.

15. The apparatus of claim 14, wherein the instructions for performing the double patterning conflict check process include instructions for identifying a loop formed by an odd number of semiconductor device patterns that are spaced apart from adjacent semiconductor device patterns within the loop by distances less than a predetermined distance.

16. The apparatus of claim 13, wherein the pseudo semiconductor device pattern includes a polygon disposed between the first and second semiconductor device patterns.

17. The apparatus of claim 13, wherein the computer program contains additional instructions for assigning all of the semiconductor device patterns of the layout plan to a plurality of photomasks in response to the designating.

* * * * *